United States Patent
Oose

(10) Patent No.: US 9,390,987 B2
(45) Date of Patent: Jul. 12, 2016

(54) SEMICONDUCTOR MODULE INCLUDING A TERMINAL EMBEDDED IN CASING WALL AND BENT OVER THICK PORTION OF LID

(71) Applicant: FUJI ELECTRIC CO., LTD., Kawasaki-shi (JP)

(72) Inventor: Tomofumi Oose, Matsumoto (JP)

(73) Assignee: FUJI ELECTRIC CO, LTD., Kawasaki-Shi (JP)

( * ) Notice: Subject to any disclaimer, the term of this patent is extended or adjusted under 35 U.S.C. 154(b) by 0 days.

(21) Appl. No.: 14/452,931

(22) Filed: Aug. 6, 2014

(65) Prior Publication Data
US 2015/0061105 A1    Mar. 5, 2015

(30) Foreign Application Priority Data
Sep. 5, 2013   (JP) .................. 2013-183696

(51) Int. Cl.
| H01L 23/043 | (2006.01) |
| H01L 23/24 | (2006.01) |
| H01L 23/528 | (2006.01) |
| H01L 23/051 | (2006.01) |
| H01L 23/049 | (2006.01) |
| H01L 23/00 | (2006.01) |

(52) U.S. Cl.
CPC ............ *H01L 23/051* (2013.01); *H01L 23/049* (2013.01); *H01L 24/01* (2013.01); *H01L 23/24* (2013.01); *H01L 2924/0002* (2013.01); *H01L 2924/13055* (2013.01)

(58) Field of Classification Search
None
See application file for complete search history.

(56) References Cited

U.S. PATENT DOCUMENTS

| 5,350,946 | A * | 9/1994 | Murakami | ........ H01L 23/49575 257/693 |
| 5,373,105 | A * | 12/1994 | Nagaune et al. | .............. 174/539 |
| 7,768,109 | B2 * | 8/2010 | Nakao | ................... H01L 23/053 257/328 |
| 8,502,365 | B2 * | 8/2013 | Onishi | .......................... 257/678 |
| 8,593,817 | B2 * | 11/2013 | Bayerer | .................. H01L 24/06 174/529 |
| 2006/0202323 | A1* | 9/2006 | Shinohara | ............... H01L 23/24 257/706 |
| 2008/0217760 | A1* | 9/2008 | Yoshihara | ............... H01L 23/36 257/693 |
| 2009/0244868 | A1* | 10/2009 | Morita | .................. H01L 23/047 361/783 |
| 2011/0069458 | A1* | 3/2011 | Nakao | ................... H01L 25/072 361/728 |
| 2013/0322025 | A1* | 12/2013 | Shinkai | ......................... 361/728 |
| 2014/0035123 | A1* | 2/2014 | Oka | ....................... H01L 23/367 257/712 |

(Continued)

FOREIGN PATENT DOCUMENTS

| JP | 06104381 A * | 4/1994 | ............. H01L 25/11 |
| JP | 11-345669 A | 12/1999 | |
| WO | WO 2013051387 A1 * | 4/2013 | |

*Primary Examiner* — Marc Armand
*Assistant Examiner* — Younes Boulghassoul
(74) *Attorney, Agent, or Firm* — Rossi, Kimms & McDowell LLP

(57) ABSTRACT

Aspects of the invention provide a semiconductor module that can be manufactured without using a bending jig for bearing the stress in bending process of the terminal and scarcely generates cracks in the resin parts of the semiconductor module. In some aspects of the invention, a semiconductor module can include a casing made of a resin material accommodating a semiconductor chip, a terminal one end of which is electrically connected to the semiconductor chip and the other end of which is projecting out of the casing and bent and a lid made of a resin material fitted on an opening of the casing, a part of end region of the lid being in contact with the terminal and being a thick part with a thickness thicker than a thickness of other parts of the lid.

10 Claims, 8 Drawing Sheets

(56) References Cited

U.S. PATENT DOCUMENTS

| | | | |
|---|---|---|---|
| 2014/0198454 A1* | 7/2014 | Yuan | H05K 7/209 361/720 |
| 2014/0233188 A1* | 8/2014 | Terasawa et al. | 361/719 |
| 2014/0299982 A1* | 10/2014 | Minamio | H01L 25/162 257/712 |
| 2014/0312464 A1* | 10/2014 | Onishi | H01L 21/565 257/618 |
| 2014/0374889 A1* | 12/2014 | Denta | H01L 25/162 257/666 |
| 2015/0115478 A1* | 4/2015 | Otsuki | H01L 23/12 257/784 |

* cited by examiner

SEMICONDUCTOR MODULE INCLUDING A TERMINAL EMBEDDED IN CASING WALL AND BENT OVER THICK PORTION OF LID

CROSS-REFERENCE TO RELATED APPLICATION

This application is based on, and claims priority to, Japanese Patent Application No. 2013-183696, filed on Sep. 5, 2013, the contents of which are incorporated herein by reference.

BACKGROUND OF THE INVENTION

1. Field of the Invention

Embodiments of the invention relate to semiconductor modules, including modules that can minimize damage of the resin around a bending part of a terminal.

2. Description of the Related Art

Japanese Unexamined Patent Application Publication No. H11-345669 (also referred to herein as "Patent Document 1") discloses a structure of a semiconductor module that can avoid damage of the resin around a bending part of the terminal. Patent Document 1 discloses a mold body including a part of an electrically connecting conductor made of a conductive metallic material constructed by insert-molding or press-fitting. This mold body has a jig-inserting groove in the basic part for a bending jig to expose the electrically connecting conductor to a side wall surface. In order to bend the electrically connecting conductor to a desired direction, a bending jig that fits to the bending position of the electrically connecting conductor is inserted into the jig-inserting groove in the mold body constructed as described above, and then, the electrically connecting conductor is bent. The document asserts that no crack is generated in the bending jig or in the basic part even through the bending jig is subjected to a bending stress when the electrically connecting conductor is bent because the bending jig is made of a sufficiently rigid material with respect to the basic part. The document also describes that the bending jig is drawn out of the jig-inserting groove after bending the electrically connecting conductor, and is used repeatedly, for vending an electrically connecting conductor of the next mold body.

The technology disclosed in Patent Document 1 has a problem that an additional handling process is needed for putting and removing the bending jig, which decreases the manufacturing rate raising the manufacturing cost. As in the description on a conventional technology that is referred to in Patent Document 1, the process of bending the terminal along the edge of the resin could generates a crack in the resin part, which also raises the manufacturing cost.

SUMMARY OF THE INVENTION

Some embodiments of the invention address the problems described above, and other problems in the related art, and can provide a semiconductor module that can be manufactured without using a bending jig for bearing the stress in bending process of the terminal and minimizes the generation of cracks in the resin parts of the semiconductor module.

A first aspect of the present invention is a semiconductor module comprising: a casing made of a resin material accommodating a semiconductor chip; a terminal one end of which is electrically connected to the semiconductor chip and another end of which is projecting out of the casing and bent; and a lid made of a resin material fitted on an opening of the casing, a part of end region of the lid being in contact with the terminal and being a thick part with a thickness thicker than a thickness of other part of the end of the lid.

In this construction of the semiconductor module, the edge of the thick part can be used as a fulcrum for bending the terminal, and an excessive stress concentration on the casing can be avoided in the bending process, preventing the casing from being damaged. Because the lid is fitted to the opening of the casing, the lid is prevented from being shifted in the process of bending the terminal using the edge of the thick part of the lid as a fulcrum. Thus, the bending position of the terminal is stabilized. Because the terminal can be bent without using any other jig, which is an easier work as compared with the case of using an inserted jig as a fulcrum for bending the terminal. Therefore, manufacturing speed of the semiconductor module can be held at a high rate, restricting a manufacturing cost. Because the semiconductor chip has been installed within the casing, even if the lid is damaged, only the inexpensive lid needs to be exchanged. Thus, an additional costs can be reduced as compared with the case of the casing that includes a semiconductor chip and is made monolithic together with the part of a fulcrum for bending the terminal. In the construction of the semiconductor module, the semiconductor chip can be electrically connected to the terminal through bonding wires, or can be directly connected to the terminal.

A second aspect of the present invention is the semiconductor module according to the first aspect of the invention, wherein a part of the terminal is embedded in a wall of the casing and a part of the terminal opposite to the part in contact with the thick part of the lid is covered with a wall of the casing.

In this construction of the semiconductor module, because the terminal is not exposed out from the side surface of the casing in the bending process of the terminal, electrical insulation in the lateral direction of the casing is secured.

A third aspect of the present invention is the semiconductor module according to the first or second aspect of the invention, wherein a lateral width of the thick part of the lid is wider than a lateral width of the terminal.

In this construction of the semiconductor module, because the stress in the process of bending the terminal is supported by the thick part, the bending process can be surely executed at the edge of the thick part.

A fourth aspect of the present invention is the semiconductor module according to any one of the first through third aspects of the invention, wherein the terminal has a through-hole in the side of the other end of the terminal and is bent in a state of exposed out of the casing, and the lid has a nut opposing the through-hole at a place separated from the end of the lid.

In this construction of the semiconductor module, a bolt can be put through a ring terminal and further through the through-hole of the terminal to screw-fitting to the nut. As a result, the terminal and the ring terminal can be tightly screw-fitted. The nut, being fixed to the lid, does not move even though the bolt is turned. Thus, the ring terminal can be fastened to the terminal by only turning the bolt. The nut can be fixed at the surface region of the lid in a configuration embedded to the lid.

A fifth aspect of the present invention is the semiconductor module according to any one of the first through fourth aspects of the invention, further comprising an engaging part(s) for engaging the casing and the lid.

In this construction of the semiconductor module, because the casing and the lid are fixed at the engaging part(s), the lid does not shift in the bending process of the terminal.

A sixth aspect of the present invention is the semiconductor module according to any one of the first through fifth aspects of the invention, wherein the lateral width of a bending place of the terminal is narrower than that of the other parts of the terminal.

In this construction of the semiconductor module, because the stress in the bending process of the terminal is concentrated to the place of narrow width of the terminal, the terminal can be bent easily at this place.

A seventh aspect of the present invention is the semiconductor module according to any one of the first through sixth aspects of the invention, wherein the thickness of a bending place of the terminal is thinner than that of the other parts of the terminal.

In this construction of the semiconductor module, because the stress in the bending process of the terminal is concentrated to the place of thin thickness of the terminal, the terminal can be bent easily at this place.

An eighth aspect of the present invention is the semiconductor module according to any one of the first through seventh aspects of the invention, wherein a transverse dimension of the through-hole is larger than the diameter of the screw hole of the nut, and the transverse dimension of the through-hole of the terminal is smaller than a longitudinal dimension of the through-hole.

In this construction of the semiconductor module, even if the bending position of the terminal shifts in the longitudinal direction of the terminal, the screw hole of the nut is held within the position of the through-hole.

A ninth aspect of the present invention is the semiconductor module according to any one of the first through eighth aspects of the invention, comprising a plurality of the terminals that are electrically connected to different parts of the semiconductor chip and bent in the same direction.

In this construction of the semiconductor module, even if the lid is damaged in the process of bending the second or the following terminal, the lid can be more easily removed and exchanged as compared with the case of different bending direction of the terminal. When a lid made monolithic by combining a plurality of lids is used in particular, if the bending direction is different among the plurality of lids, the lids cannot be removed until all the lids fully restore the original state. However, in the case of the same bending direction, only picking up a little the terminals up to the position to just release the lids allows the lids to be removed. Moreover, the plurality of terminals can be bent simultaneously, which improves productivity.

A tenth aspect of the present invention is the semiconductor module according to any one of the fourth through ninth aspects of the invention, wherein the lid has a nut support under the nut for supporting the nut and the lid is provided with a space having a width larger than the diameter of the screw hole of the nut under the screw hole.

In this construction of the semiconductor module, even when the length of the bolt is longer than the length of the screw hole of the nut, the bolt can be screw-fitted to the nut. Therefore, the restriction on the length of the bolt is relaxed.

A semiconductor module of the present invention can be manufactured without using a bending jig that bears the stress in the terminal bending process, and scarcely suffers from crack generation in the resin part of the semiconductor module.

DETAILED DESCRIPTION

Some embodiments of the invention will be described in detail in the following with reference to the accompanying drawings. In some instances, the same components are given the same symbols, and repeated descriptions thereon are avoided. Embodiments of the invention are not limited to the embodiments described below, but any variations and modifications are possible within the spirit and scope of the invention.

Embodiment Example 1

Figure 1:
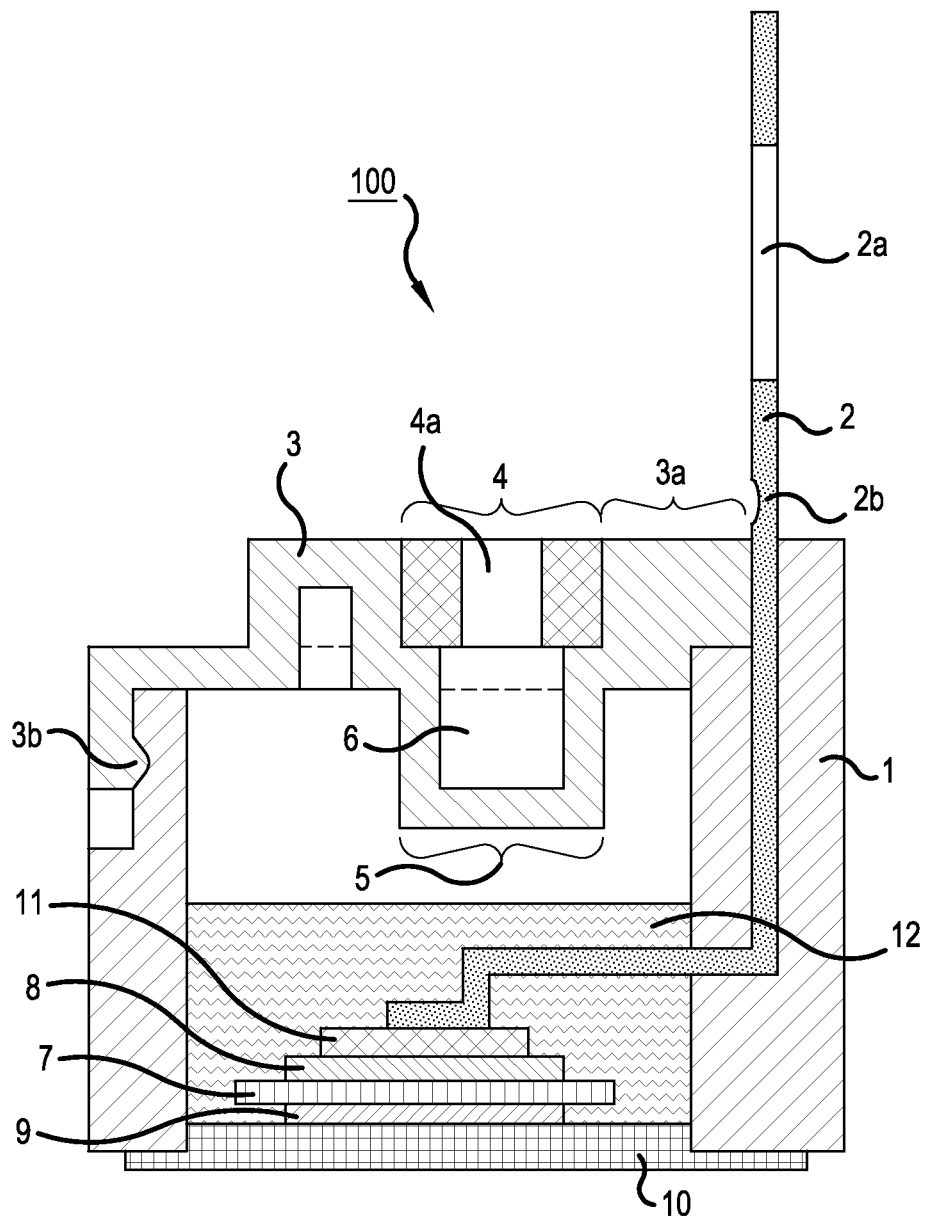
FIG. 1 is a sectional view cut along the line A-A in FIG. 3 of a semiconductor module before bending a terminal thereof, according to Embodiment Example 1 of the present invention.
Figure 2:
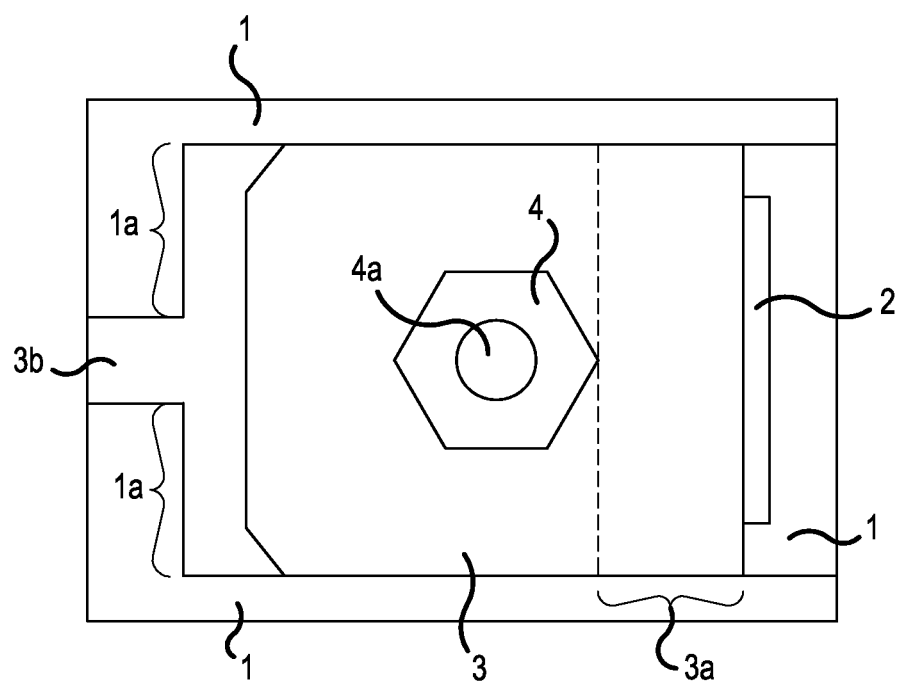
FIG. 2 is a plan view of a semiconductor module according to Embodiment Example 1 of the present invention.
Figure 3:
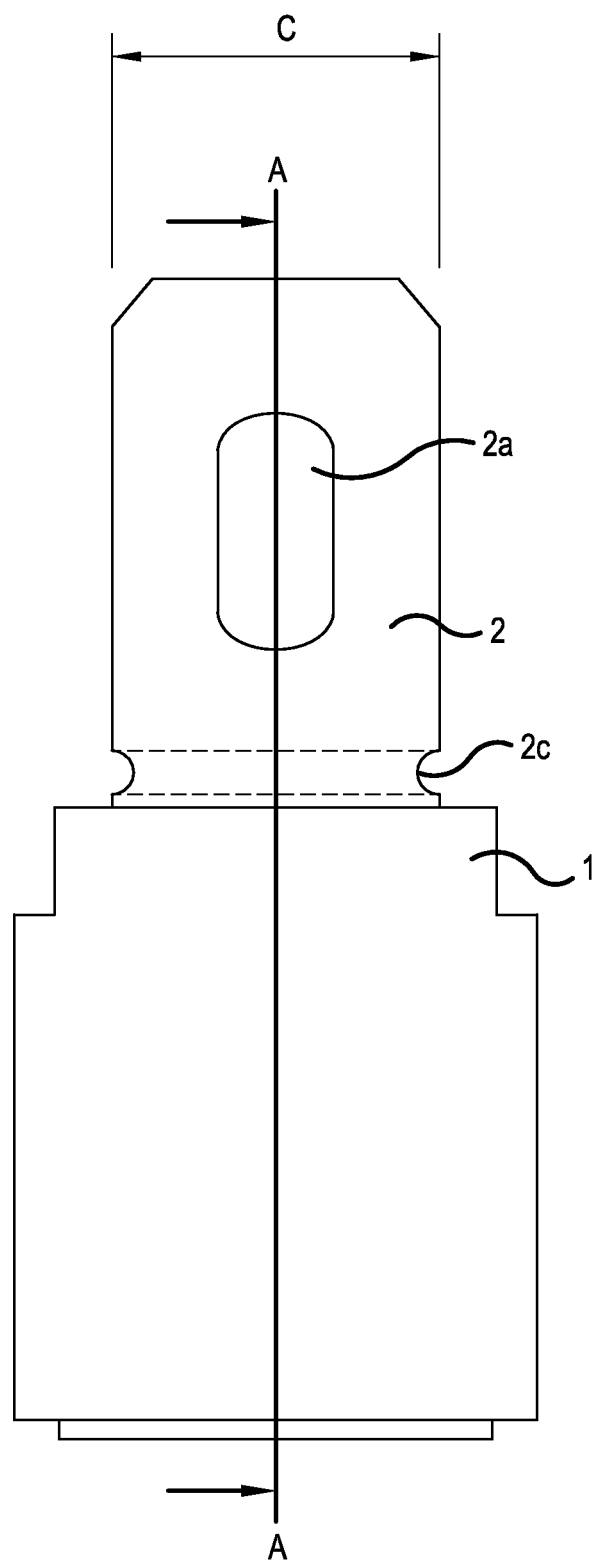
FIG. 3 is a side view of a semiconductor module according to Embodiment Example 1 of the present invention.
Figure 4:
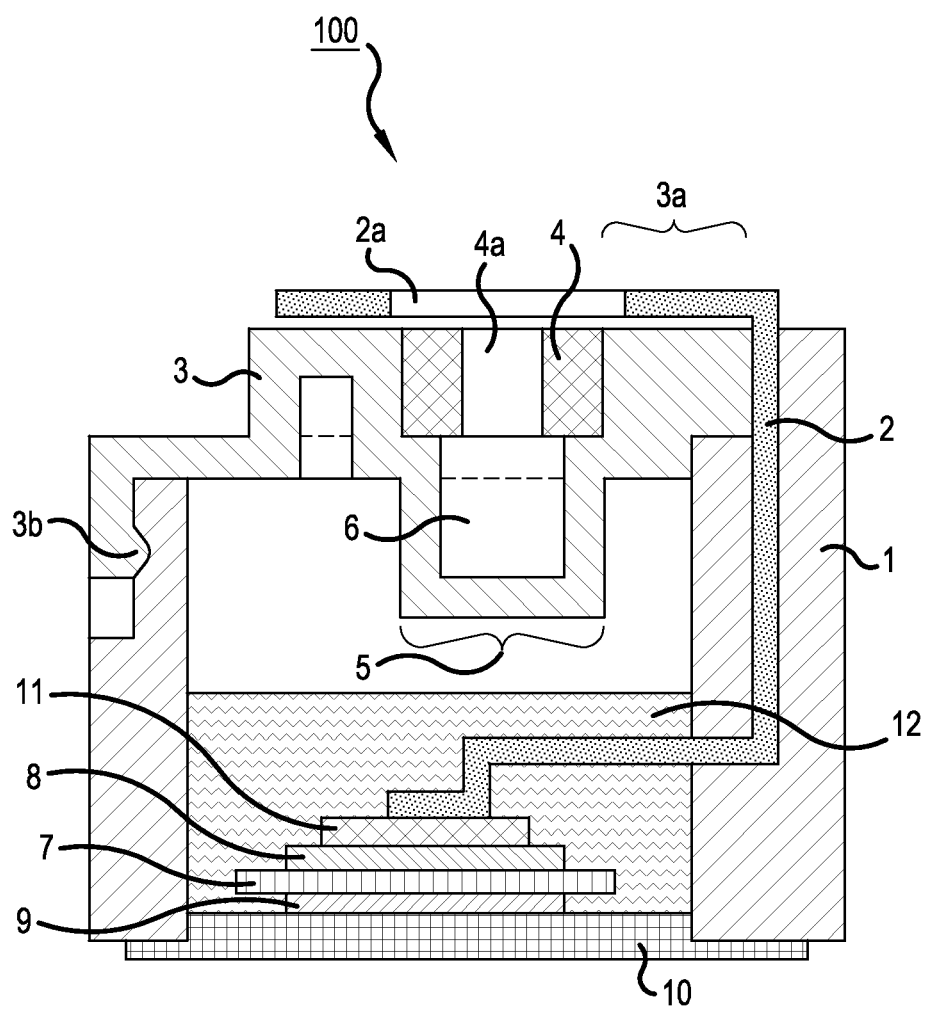
FIG. 4 is a sectional view cut along the line B-B in FIG. 6 of a semiconductor module after bending a terminal thereof, according to Embodiment Example 1 of the present invention.
Figure 5:
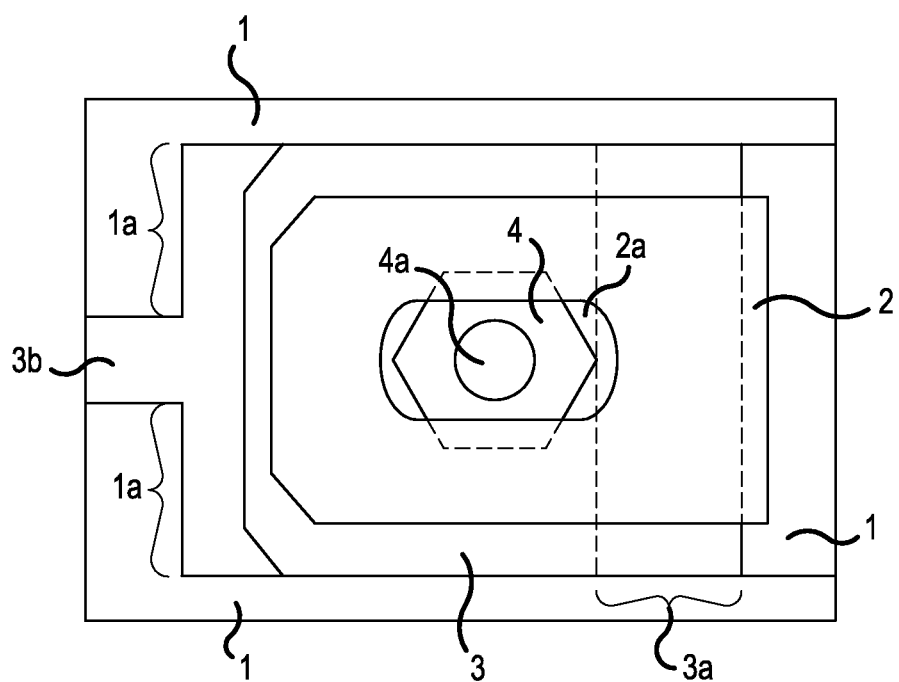
FIG. 5 is a plan view of a semiconductor module after bending a terminal thereof according to Embodiment Example 1 of the present invention.
Figure 6:
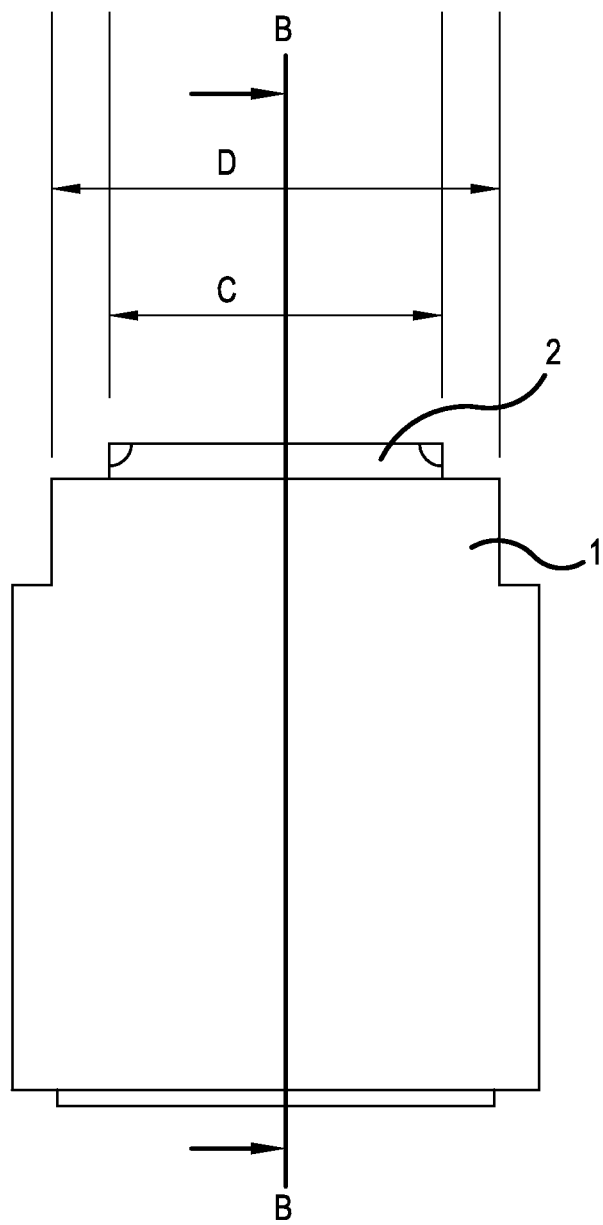
FIG. 6 is a side view of a semiconductor module after bending a terminal thereof according to Embodiment Example 1 of the present invention.

A first embodiment of the invention, Embodiment Example 1, will be described in the following. FIG. 1 is a sectional view cut along the line A-A in FIG. 3 of a semiconductor module before bending a terminal thereof, according to the first embodiment of the present invention. FIG. 2 is a plan view of a semiconductor module according to the first embodiment of the present invention; FIG. 3 is a side view of a semiconductor module according to the first embodiment of the present invention; FIG. 4 is a sectional view cut along the line B-B in FIG. 6 of a semiconductor module after bending a terminal thereof, according to the first embodiment of the present invention; FIG. 5 is a plan view of a semiconductor module after bending a terminal thereof according to the first embodiment of the present invention; and FIG. 6 is a side view of a semiconductor module after bending a terminal thereof according to the first embodiment of the present invention.

Referring to FIG. 1, the semiconductor module 100 according to Embodiment Example 1 of the invention comprises: a casing 1, a terminal 2, a lid 3, a nut 4, an insulating substrate 7, a conducting circuit layer 8, a metallic layer 9, a metal plate 10, a semiconductor chip 11, and silicone gel 12. The casing 1 made of a resin material accommodates a semiconductor chip 11. A part of the terminal 2 is embedded in the side wall of the casing 1. As shown in FIG. 2, there is a first engaging part 1a at the place in contact with an end of the lid 3 opposite to the side of the embedded terminal 2. The top and bottom of the casing 1 are opened. The top opening is covered by the lid 3, and the bottom opening is closed by the metal plate 10.

As shown in FIG. 4, one end of the terminal 2 is electrically connected to the semiconductor chip 11, and the other end is projecting out of the casing 1 and bent. A part of the terminal 2 is embedded in the wall of the casing 1. A region of the terminal 2 that is backside of the region in contact with the thick part 3a of the lid 3 is covered by the wall of the casing 1. A through-hole 2a is formed in the part of the terminal 2 projecting out of the casing 1. The transverse dimension of the through-hole 2a is larger than the diameter of the screw hole 4a of the nut 4. The transverse dimension of the through-hole 2a of the terminal 2 is smaller than the longitudinal dimension of the through-hole 2a of the terminal 2.

In the vicinity of the bottom part of the protruding terminal from the casing 1, a thin part 2b and a notch 2c are formed. Although both of the thin part 2b and the notch 2c are provided in this example, only either one may be provided. The thin part 2b can be formed on both surfaces or on only one surface of the terminal 2. The thin part 2b is formed on the surface in the side toward which the terminal 2 is to be bent. Because the thickness of the part of the terminal 2 is thinner than that of other parts of the terminal 2, stress concentration takes place at the thin part 2b. As a result, the terminal 2 is bent at the thin part 2b. The notches 2c are formed at both side edges of the terminal 2. The transverse dimension of the terminal 2 at the part to be bent is smaller than that at other parts of the terminal 2 as shown in FIG. 3. Because stress concentration occurs at the part between the notches 2c when the terminal 2 is bent, the terminal bends at the part between the notches 2c.

The lid 3 made of a resin material is fitted to the top opening of the casing 1. A part of the end region is in contact with the terminal 2, and forms a thick part 3a having a larger thickness than other parts of the end region of the lid 3 as can be seen in FIG. 1 and FIG. 4. The lateral dimension D of the thick part 3a of the lid 3 is larger than the lateral dimension C of the terminal 2, as shown in FIG. 6. The lid 3 has a nut 4 fixed on the surface of the lid 3 at the place opposing the through-hole 2a after bent and with a certain distance from the end of the lid. A screw-hole 4a is bored in the center of the nut 4. The lid 3 has a nut support 5 for supporting the nut 4. The nut support 5 has a space with a width larger than the diameter of the screw hole 4a under the screw hole 4a.

The second engaging part 3b is provided at the end of the lid 3 opposite to the thick part 3a. The second engaging part 3b works together with the first engaging part 1a to fix the lid 3 to the casing 1. The side wall of the casing 1 is held between the second engaging part 3b and the part of the casing 1 facing the first engaging part 1a. A pit is formed on the side wall of the casing 1 below the second engaging part 3b. The lid 3 is removed by inserting a tool into this pit to release the second engaging part 3b. A bolt (not depicted in any figures) is put through a ring terminal (not depicted in any figures) and further put through the through-hole 2a of the terminal 2, and then screwed into the nut 4. The space 6 is provided so that the bolt does not interfere with the lid 3 in this screwing process even through the screw part of the bolt is longer than the length of the nut 4.

A conducting circuit layer 8 is disposed on the upper surface of the insulating substrate 7, and a metallic layer 9 is disposed beneath the insulating substrate 7. The insulating substrate 7 is made of a ceramic material such as aluminum oxide or aluminum nitride. The conducting circuit layer 8 and the metallic layer 9 are made of copper or aluminum, for example. The semiconductor chip 11 is soldered on the conducting circuit layer 8. The metallic layer 9 is soldered to the metal plate 10, which is composed of aluminum, for example. The metallic layer 9 and the metal plate 10 are provided for radiating the heat generated in the semiconductor chip 11.

The silicone gel 12 fills the inner space of the casing 1 so as to cover the insulating substrate 7, the conducting circuit layer 8, the metallic layer 9, the upper surface of the metal plate 10, the semiconductor chip 11, and a part of the terminal 2. Being covered with the silicone gel 12, these components are prevented from oxidization to elongate the life of the semiconductor module 100. Though not depicted, a semiconductor module according to another embodiment of the invention can be provided with a second terminal that is directly drawn out of the casing 1, in addition to the terminal 2 described above. This module can be provided with a second semiconductor chip for controlling the semiconductor chip 11 that is controlled by control signals from the second terminal.

Embodiment Example 2

Figure 7:
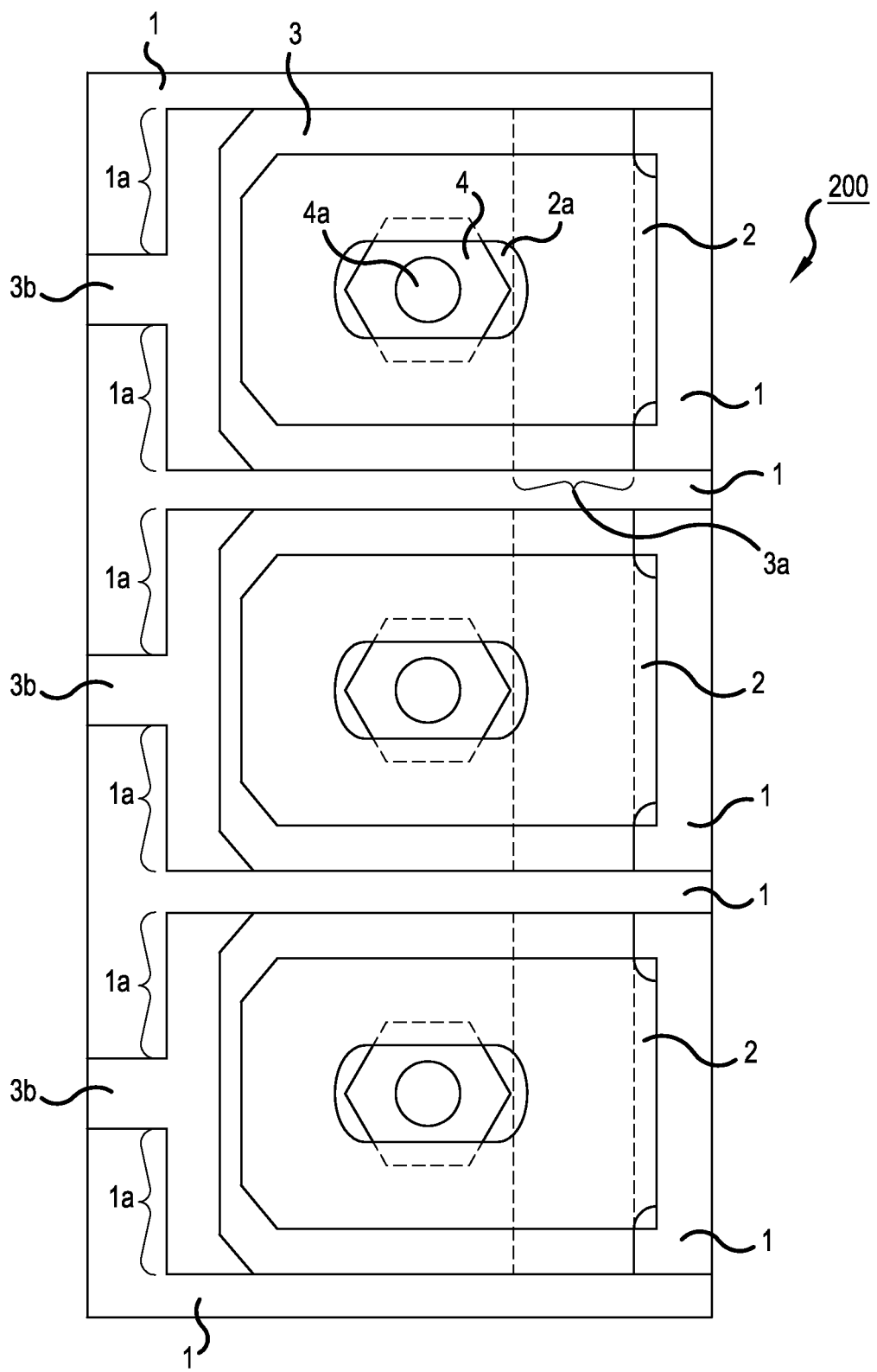
FIG. 7 is a plan view of a semiconductor module after bending a terminal thereof according to Embodiment Example 2 of the present invention.

The following describes Embodiment Example 2 of the invention. FIG. 7 is a plan view of a semiconductor module after bending the terminal thereof according to Embodiment Example 2 of the invention. This semiconductor module 200 is composed of a plurality of the semiconductor modules according to Embodiment Example 1 arranged laterally. The semiconductor module 200 especially comprises a plurality of terminals 2 electrically connected to different parts of the semiconductor chip 11, the terminals 2 being bent in the same direction. More specifically, the terminals 2 are connected to a gate electrode, an emitter electrode, and a collector electrode of a single semiconductor chip, which can be an insulated gate bipolar transistor (IGBT). Other constructions are same as those in the semiconductor module according to Embodiment Example 1 and details thereon are omitted here.

Because the lids 3 are provided separately, exchange of only one lid 3 that needs to be exchanged is possible. Because the terminals 2 are bent in the same direction, all the lids 2 can be bent simultaneously and the terminals can be bent using a tool with a simple structure.

Embodiment Example 3

Figure 8:
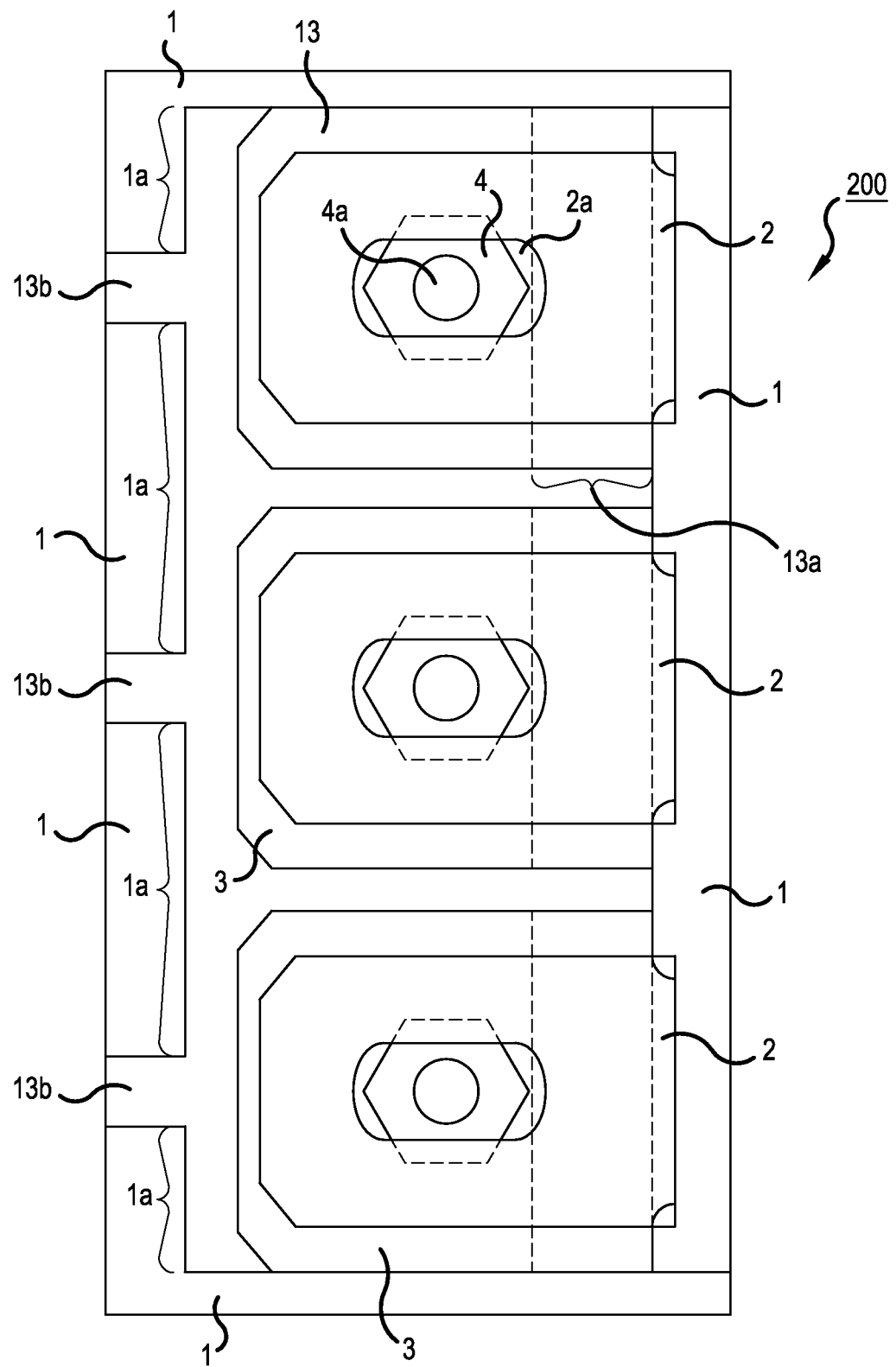
FIG. 8 is a plan view of a semiconductor module after bending a terminal thereof according to Embodiment Example 3 of the present invention.

The following describes Embodiment Example 3 of the invention. FIG. 8 is a plan view of a semiconductor module after bending the terminal thereof according to Embodiment Example 3 of the invention. This semiconductor module 300 is same as the semiconductor module 200 according to Embodiment Example 2 except that the lids 3 of the semiconductor 200 are made monolithic forming a lid 13 and the casing 1 is formed so as to engage with the lid 13. Second engaging parts 13b are provided at the ends of the lid 3 at the opposite side to the thick parts 3a. The second engaging parts 13b works together with the first engaging parts 1a to fix the lid 13 to the casing 1. The side wall of the casing 1 is put between the part of the lid 13 opposing to the first engaging parts 1a and the second engaging parts 13b and fixed. Because the lid 13 is a common lid for every terminal 2, attaching work for the lid 13 is simplified in the assembling process of the semiconductor module 300.

As described thus far, the semiconductor module according to the embodiment of the invention can be manufactured without using a bending jig for bearing the stress in bending process of the terminal and minimizes generation of cracks in the resin parts of the semiconductor module.

What is claimed is:
1. A semiconductor module comprising:
a casing made of a resin material accommodating a semiconductor chip;
a terminal, one end of which is directly electrically connected to the semiconductor chip, and another end of which is projecting out of the casing and bent; and a lid made of a resin material fitted on an opening of the casing, a part of an end region of the lid being in contact with the terminal and being a thick part with a thickness thicker than a thickness of another part of the end region of the lid, wherein a first portion of a horizontal section of the terminal is embedded in a silicone gel, a second portion of the horizontal section part of the terminal is embedded in a wall of the casing, a vertical section of the terminal is embedded in the wall of the casing, and a part of the vertical section of the terminal opposite to the part in contact with the thick part of the lid is covered with a wall of the casing, wherein the thick part is an edge of the lid.

2. The semiconductor module according to claim 1, wherein a lateral width of the thick part of the lid is wider than a lateral width of the terminal.

3. The semiconductor module according to claim 1, wherein the terminal has a through-hole in a side of the other end of the terminal and is bent in a state such that it protrudes out of the casing, and the lid has a nut opposing the through-hole at a location spaced apart from the end region of the lid.

4. The semiconductor module according to claim 3, wherein a transverse dimension of the through-hole is larger than the diameter of the screw hole of the nut, and the transverse dimension of the through-hole of the terminal is smaller than a longitudinal dimension of the through-hole.

5. The semiconductor module according to claim 3, wherein the lid has a nut support under the nut for supporting the nut and the lid is provided with a space having a width larger than the diameter of the screw hole of the nut under the screw hole.

6. The semiconductor module according to claim 3, wherein the thick part is in contact with a side of the terminal facing the nut.

7. The semiconductor module according to claim 1, further comprising one or more engaging parts for engaging the casing and the lid.

8. The semiconductor module according to claim 1, wherein a lateral width of a bending place of the terminal is narrower than that of other parts of the terminal.

9. The semiconductor module according to claim 1, wherein a thickness of a bending place of the terminal is thinner than that of other parts of the terminal.

10. The semiconductor module according to claim 1, comprising a plurality of the terminals that are connected to different parts of the semiconductor module.

* * * * *